(12) United States Patent
Takita et al.

(10) Patent No.: US 11,843,022 B2
(45) Date of Patent: *Dec. 12, 2023

(54) X-RAY IMAGING PANEL AND METHOD OF MANUFACTURING X-RAY IMAGING PANEL

(71) Applicant: SHARP KABUSHIKI KAISHA, Sakai (JP)

(72) Inventors: Rikiya Takita, Sakai (JP); Akinori Kubota, Sakai (JP); Hiroyuki Moriwaki, Sakai (JP); Makoto Nakazawa, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 5 days.

This patent is subject to a terminal disclaimer.

(21) Appl. No.: 17/536,619

(22) Filed: Nov. 29, 2021

(65) Prior Publication Data
US 2022/0181379 A1 Jun. 9, 2022

Related U.S. Application Data

(60) Provisional application No. 63/121,090, filed on Dec. 3, 2020.

(51) Int. Cl.
*H01L 27/146* (2006.01)
*G01T 1/20* (2006.01)
*H01L 29/786* (2006.01)

(52) U.S. Cl.
CPC .... *H01L 27/14663* (2013.01); *G01T 1/20188* (2020.05); *H01L 27/14616* (2013.01); *H01L 27/14689* (2013.01); *H01L 29/7869* (2013.01)

(58) Field of Classification Search
CPC ........... G01T 1/20188; H01L 27/14616; H01L 27/14663; H01L 27/14689; H01L 29/7869
See application file for complete search history.

(56) References Cited

U.S. PATENT DOCUMENTS

| | | | | |
|---|---|---|---|---|
| 4,766,085 A | * | 8/1988 | Nishigaki | H01L 27/14665 257/E27.141 |
| 2005/0250308 A1 | * | 11/2005 | Yamaguchi | H01L 27/1214 438/618 |
| 2007/0045556 A1 | * | 3/2007 | Watanabe | H01L 27/14659 257/E27.141 |

(Continued)

FOREIGN PATENT DOCUMENTS

WO 2018/025819 A1 2/2018

*Primary Examiner* — Blake C Riddick
(74) *Attorney, Agent, or Firm* — ScienBiziP, P.C.

(57) ABSTRACT

An X-ray imaging panel includes: a photodiode that converts scintillation light that is obtained from an X-ray that passes through an object into a signal; a first thin-film transistor; a first insulating film that covers at least a part of the first thin-film transistor and that has a first opening above the first thin-film transistor; a lower electrode that is disposed below the photodiode, that covers at least a part of the first insulating film, that is formed in the first opening of the first insulating film, and that is connected to the first thin-film transistor in the first opening; and a second insulating film that is disposed above the lower electrode and that is formed in the first opening. The photodiode covers the first opening in which the second insulating film is formed, and the photodiode is connected to the lower electrode.

8 Claims, 12 Drawing Sheets

(56) References Cited

U.S. PATENT DOCUMENTS

| | | | |
|---|---|---|---|
| 2008/0210946 A1* | 9/2008 | Okada | H01L 27/14603 257/E27.146 |
| 2008/0211045 A1* | 9/2008 | Ono | H01L 27/14685 257/E31.127 |
| 2010/0193691 A1* | 8/2010 | Ishii | H01L 27/14663 156/247 |
| 2011/0204374 A1* | 8/2011 | Kimura | H01L 31/101 438/479 |
| 2012/0032088 A1* | 2/2012 | Ishii | H01L 27/14663 250/208.2 |
| 2012/0306041 A1* | 12/2012 | Fujiyoshi | H01L 27/1462 257/E31.124 |
| 2013/0140568 A1* | 6/2013 | Miyamoto | H01L 27/14603 257/53 |
| 2013/0299711 A1* | 11/2013 | Mochizuki | H01L 27/14643 257/292 |
| 2013/0307041 A1* | 11/2013 | Mochizuki | H01L 27/14663 257/292 |
| 2014/0035006 A1* | 2/2014 | Fujiyoshi | H01L 27/14812 257/225 |
| 2014/0097348 A1* | 4/2014 | Watanabe | H01L 27/14612 257/292 |
| 2014/0306869 A1* | 10/2014 | Fujita | H10K 50/11 546/4 |
| 2014/0353470 A1* | 12/2014 | Kawanabe | H01L 27/14663 438/73 |
| 2014/0353651 A1* | 12/2014 | Takimoto | H01L 27/1464 257/40 |
| 2014/0374610 A1* | 12/2014 | Nishino | G01T 1/20184 250/370.09 |
| 2015/0003040 A1* | 1/2015 | Bessho | H01L 33/507 362/84 |
| 2015/0076358 A1* | 3/2015 | Okada | H01L 27/14609 250/370.08 |
| 2015/0188065 A1* | 7/2015 | Takimoto | H01L 27/14685 257/40 |
| 2016/0035768 A1* | 2/2016 | Kawahara | H01L 27/14689 257/292 |
| 2016/0372520 A1* | 12/2016 | Joei | H10K 30/57 |
| 2017/0092673 A1* | 3/2017 | Miyamoto | H01L 27/14616 |
| 2018/0114909 A1* | 4/2018 | Hayashi | H10K 30/00 |
| 2018/0151624 A1* | 5/2018 | Hasegawa | H10K 30/353 |
| 2019/0013342 A1* | 1/2019 | Kato | H04N 25/00 |
| 2019/0019833 A1* | 1/2019 | Kodaira | H01L 27/14623 |
| 2019/0165183 A1* | 5/2019 | Terai | H10K 77/111 |
| 2019/0170884 A1 | 6/2019 | Misaki | |
| 2019/0237692 A1* | 8/2019 | Nakazawa | H10K 30/88 |
| 2020/0161360 A1* | 5/2020 | Misaki | H01L 27/14616 |

* cited by examiner

X-RAY IMAGING PANEL AND METHOD OF MANUFACTURING X-RAY IMAGING PANEL

CROSS-REFERENCE TO RELATED APPLICATION

The present application claims priority from Provisional Application 63/121,090, the content to which is hereby incorporated by reference into this application.

BACKGROUND OF THE INVENTION

1. Field of the Invention

The present disclosure relates to an X-ray imaging panel and a method of manufacturing an X-ray imaging panel.

2. Description of the Related Art

An X-ray imaging panel and a method of manufacturing an X-ray imaging panel are known. The X-ray imaging panel and the method of manufacturing an X-ray imaging panel are disclosed in, for example, International Publication No. 2018/025819.

An X-ray imaging panel that includes a thin-film transistor, a photoelectric conversion layer, and a lower electrode is disclosed in International Publication No. 2018/025819 described above. The lower electrode is disposed below the photoelectric conversion layer and connects the photoelectric conversion layer and the thin-film transistor to each other. A flattening film that is composed of resin is formed on the thin-film transistor to flatten unevenness due to the thin-film transistor. The flattening film has a contact hole for connecting the thin-film transistor and the lower electrode to each other. The lower electrode is formed on an inner surface around the contact hole. A part of the photoelectric conversion layer is disposed so as to fill the contact hole inside the lower electrode.

SUMMARY

As in the X-ray imaging panel disclosed in International Publication No. 2018/025819 described above, the photoelectric conversion layer and the thin-film transistor can be arranged so as to overlap in a plan view in a manner in which the contact hole is formed below the photoelectric conversion layer, and this enables an area for every single pixel in a plan view to be decreased or enables a pitch between pixels to be decreased. Consequently, the resolution of the X-ray imaging panel can be improved.

In International Publication No. 2018/025819 described above, however, the part of the photoelectric conversion layer is disposed so as to fill the contact hole (an opening) inside the lower electrode. For this reason, the photoelectric conversion layer (a photodiode) has unevenness in a thickness direction. The photoelectric conversion layer (the photodiode) that has the unevenness in the thickness direction has a problem in that a leakage current is stronger than that in the case where the photodiode is flattened. For example, it is thought that the unevenness of the photodiode in the thickness direction leads to a reduction in crystalline nature of a portion at which a semiconductor layer (an N-layer) in the photodiode is joined to an electrode (a cathode) and causes a portion at which the leakage current increases.

The disclosure has been accomplished to solve the above problems, and it is an object of the disclosure to provide an X-ray imaging panel and a method of manufacturing an X-ray imaging panel that improve resolution and that inhibit the leakage current in a photodiode from increasing.

To achieve the above object, an X-ray imaging panel according to a first aspect disclosed below includes a photodiode that converts scintillation light that is obtained from an X-ray that passes through an object into a signal, a first thin-film transistor, a first insulating film that covers at least a part of the first thin-film transistor and that has a first opening above the first thin-film transistor, a lower electrode that is disposed below the photodiode, that covers at least a part of the first insulating film, that is formed in the first opening of the first insulating film, and that is connected to the first thin-film transistor in the first opening, and a second insulating film that is disposed above the lower electrode and that is formed in the first opening. The photodiode covers the first opening in which the second insulating film is formed, and the photodiode is connected to the lower electrode.

A method of manufacturing an X-ray imaging panel according to a second aspect is a method of manufacturing an X-ray imaging panel that includes a photodiode that converts scintillation light that is obtained from an X-ray that passes through an object into a signal. The method includes a step of forming a first thin-film transistor on a substrate, a step of forming a first insulating film such that the first insulating film covers at least a part of the first thin-film transistor, a step of forming a first opening in the first insulating film above the first thin-film transistor, a step of forming a lower electrode in the first opening such that the lower electrode covers at least a part of the first insulating film and is connected to the first thin-film transistor in the first opening, a step of forming a second insulating film in the first opening above the lower electrode, and a step of forming a photodiode such that the photodiode covers the first opening in which the second insulating film is formed, and the photodiode is connected to the lower electrode.

According to the first or second aspect described above, the second insulating film that is formed in the first opening enables the photodiode to be inhibited from having unevenness. For this reason, leakage current at the photodiode can be inhibited from increasing even in the case where the first insulating film that covers the thin-film transistor has the first opening for connecting the thin-film transistor and the lower electrode that is disposed below the photodiode to each other. Consequently, resolution is improved, and the leakage current at the photodiode can be inhibited from increasing.

DETAILED DESCRIPTION

Figure 1:
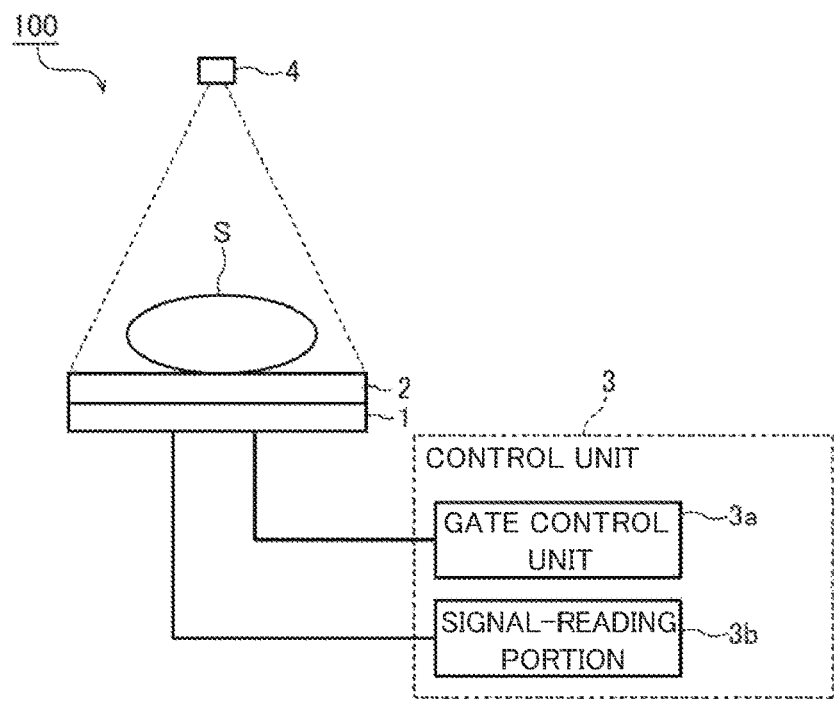
FIG. 1 schematically illustrates the structure of an X-ray imaging device according to a first embodiment.

Embodiments of the present disclosure will hereinafter be described with reference to the drawings. The present disclosure is not limited to the embodiments described below, and design can be appropriately modified within a range in which a structure according to the present disclosure is satisfied. In the following description, like reference signs for like portions or portions that have substantially like functions are shared and used in the different drawings, and the repeated description thereof is omitted. Components described according to the embodiments and a modification may be appropriately combined or changed without departing from the spirit of the present disclosure.

In the drawings that are referred in the following description, a component is simplified or schematically illustrated, and a component is omitted to make the description easy to understand. The ratio of the dimensions of components illustrated in the drawings is not necessarily equal to that of actual dimensions.

First Embodiment

FIG. 1 schematically illustrates an X-ray imaging device 100 that includes an X-ray imaging panel 1 according to a first embodiment. The X-ray imaging device 100 includes the X-ray imaging panel 1, a scintillator 2, a control unit 3, and an X-ray source 4. The control unit 3 includes a gate control unit 3a and a signal-reading portion 3b.

The X-ray source 4 emits X-rays to an object S. The X-rays that pass through the object S are converted into fluorescence (referred to below as scintillation light) at the scintillator 2 that is disposed on an upper portion of the X-ray imaging panel 1. The X-ray imaging panel 1 converts the scintillation light into an electrical signal. The X-ray imaging device 100 images the scintillation light at the X-ray imaging panel 1 and obtains an X-ray image by using the control unit 3. The words "upper", "above", and "upper portion" mean directions toward the scintillator 2 (a position on which light is incident) when viewed from the X-ray imaging panel 1. The words "lower", "below", and "lower portion" mean directions opposite the directions toward the scintillator 2 when viewed from the X-ray imaging panel 1.

Figure 2:
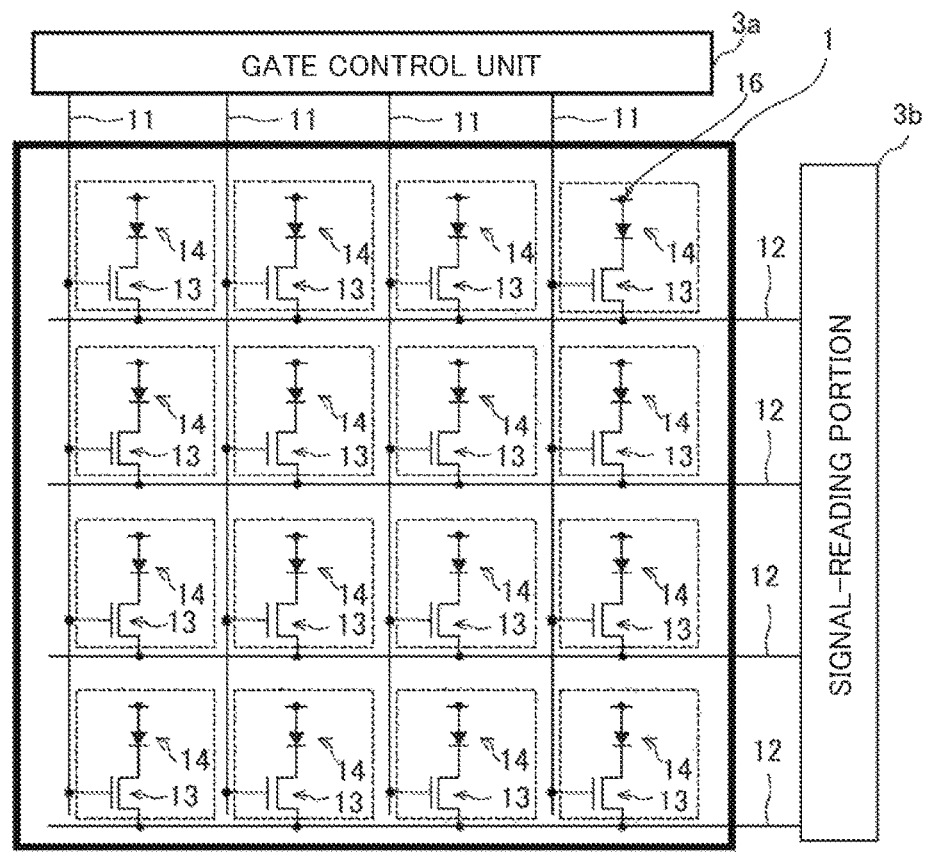
FIG. 2 is a schematic plan view of the structure of an X-ray imaging panel.

FIG. 2 is a schematic plan view of the structure of the X-ray imaging panel 1. The X-ray imaging panel 1 includes gate wiring lines 11, data wiring lines 12, thin-film transistors (TFTs) 13 (first thin-film transistors), and photodiodes 14. In the X-ray imaging panel 1, the gate wiring lines 11 and the data wiring lines 12 are formed so as to intersect each other. The TFTs 13 and the photodiodes 14 are disposed in regions (pixels) that are surrounded by the gate wiring lines 11 and the data wiring lines 12. Each photodiode 14 includes a photoelectric conversion layer (see FIG. 3) that converts the scintillation light, into which the X-rays that pass through the object S are converted, into an electric charge (the electrical signal) depending on the amount of the light. Bias wiring lines 16 that apply voltage to the photodiodes 14 are formed.

Voltage is applied to the bias wiring lines 16 by using the control unit 3. The TFTs 13 that are connected to the gate wiring lines 11 are sequentially turned on by using the gate control unit 3a. When the TFTs 13 are turned on, signals depending on the electric charges that are converted by the photodiodes 14 are outputted to the signal-reading portion 3b via the data wiring lines 12.

(Detailed Structure of X-ray Imaging Panel)

Figure 3:
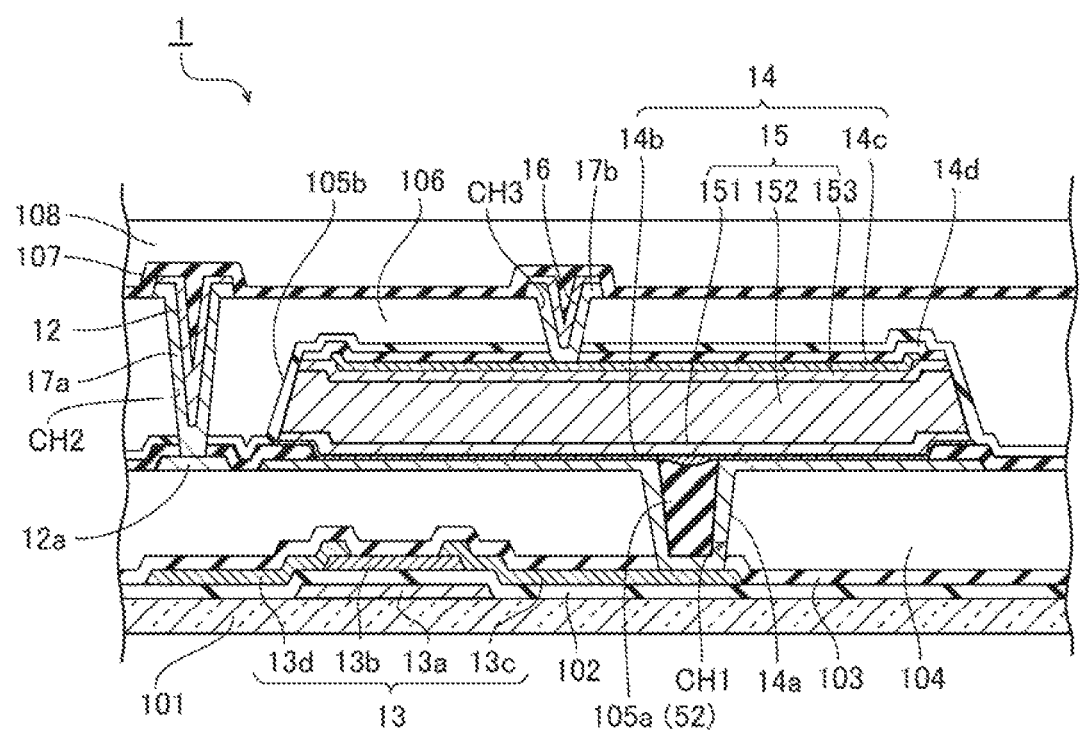
FIG. 3 is a sectional view of the structure of an X-ray imaging panel according to the first embodiment.
Figure 4:
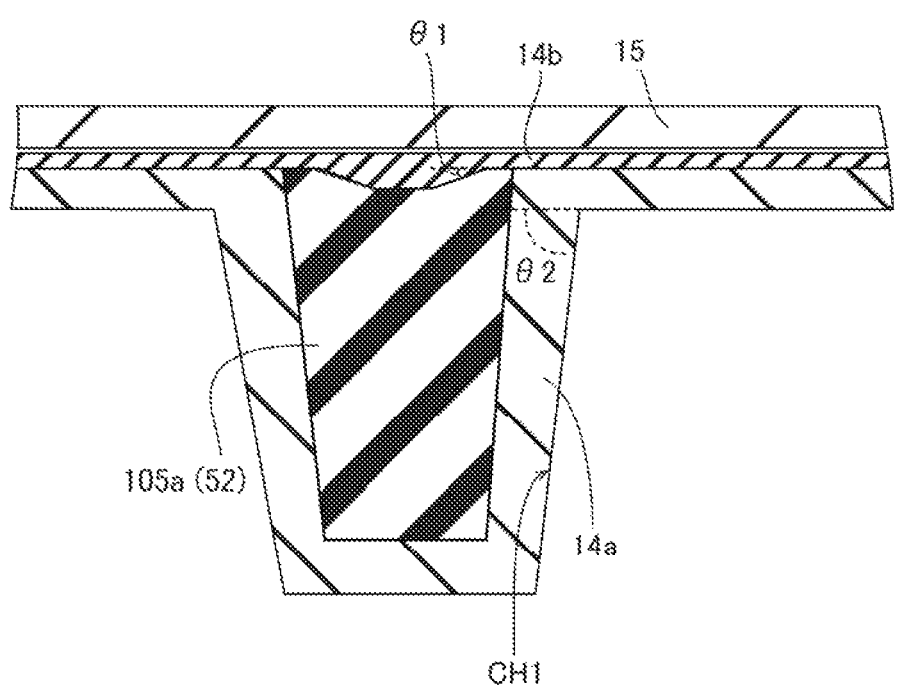
FIG. 4 is a partial enlarged view of the structure of a first opening of the X-ray imaging panel.

Referring to FIG. 3 and FIG. 4, the detailed structure of the X-ray imaging panel 1 will be described. FIG. 3 is a sectional view of a part of the X-ray imaging panel 1. FIG. 4 is an enlarged view of a portion of a first opening CH1 in FIG. 3.

(Structure of Photodiode and TFT)

As illustrated in FIG. 3, each TFT 13 of the X-ray imaging panel 1 includes a gate electrode 13a that is connected to the gate wiring line 11, a semiconductor active layer 13b (a first semiconductor layer), a source electrode 13c that is connected to the photodiode 14, and a drain electrode 13d that is connected to the data wiring line 12. Each photodiode 14 includes a lower electrode 14a, a cathode 14b, an anode 14c, and a photoelectric conversion layer 15. The photoelectric conversion layer 15 is disposed between the cathode 14b and the anode 14c. The source electrodes 13c and the cathode 14b are connected to each other with the lower electrode 14a that is disposed in the first opening CH1 and that extends through the first opening CH1 interposed therebetween.

The data wiring line 12 is connected to a data connection electrode 12a with a data electrode 17a that extends through a data-wiring-line-connection opening CH2 interposed therebetween. The bias wiring line 16 is connected to the anode 14c of the photodiodes 14 with a bias electrode 17b that extends through a bias-wiring-line-connection opening CH3 interposed therebetween. The drain electrode 13d is connected to the data wiring line 12 with the data connection electrode 12a interposed therebetween although this is not illustrated in FIG. 3.

(Structure of Layer)

As illustrated in FIG. 3, the gate electrode 13a is formed on a substrate 101. An example of the substrate 101 is a glass substrate that has an insulating property. For example, the gate electrode 13a is formed as a multilayer film that contains materials of tungsten (W) and tantalum nitride (TaN). A gate insulating film 102 is formed so as to cover the gate electrode 13a. As for the gate insulating film 102, for example, an insulating film composed of silicon dioxide (SiO$_2$) is stacked in an upper layer, and an insulating film composed of silicon nitride (SiN$_x$) is stacked in a lower layer.

The semiconductor active layer 13b, and the source electrodes 13c and the drain electrodes 13d that are connected to the semiconductor active layer 13b are formed above the gate electrode 13a with the gate insulating film 102 interposed therebetween. According to the first embodiment, the semiconductor active layer 13b is composed of an oxide semiconductor. An example of the oxide semiconductor is an amorphous oxide semiconductor that contains a predetermined ratio of indium (In), gallium (Ga), and zinc (Zn). This structure enables the off-leakage current of each TFT 13 to be reduced unlike amorphous silicon (a-Si). When the off-leakage current of the TFT 13 is weak, a sensor panel with high sensitivity is obtained, and the X-ray imaging panel 1 that receives low radiation exposure can be obtained. The semiconductor active layer 13b is not limited thereto. InGaO3(ZnO)5, magnesium oxide zinc (MgxZn1-xO), cadmium oxide zinc (CdxZn1-xO), cadmium oxide (CdO), InSnZnO (containing In (indium), Sn (tin), and Zn (zinc)), or In (indium)-Al (aluminum)-Zn (zinc)-O (oxygen) amorphous oxide semiconductor, for example, may be used. An "amorphous" material or a "crystalline (including polycrystal, fine crystal, and c-axis orientation)" material can be used as the oxide semiconductor.

The source electrode 13c and the drain electrode 13d are disposed on the gate insulating film 102 so as to be in contact with parts of the semiconductor active layer 13b. The source electrode 13c and the drain electrode 13d are formed in the same layer. For example, the source electrode 13c and the drain electrode 13d have a three-layer structure in which a metal film composed of aluminum (Al) is interposed between two metal films composed of titanium (Ti).

As illustrated in FIG. 3, a first passivation film 103 is disposed on the gate insulating film 102 so as to cover the source electrode 13c and the drain electrode 13d. The first passivation film 103 has an opening (a contact hole) on the source electrodes 13c. The first passivation film 103 is composed of, for example, silicon oxide (SiO$_2$).

A first insulating film 104 is disposed on the first passivation film 103. That is, the first insulating film 104 is formed in a layer above the TFT 13. Consequently, the first insulating film 104 covers at least a part of the TFT 13 and functions as a flattening film in the TFT 13. The first insulating film 104 has the first opening CH1 (a contact hole) on the source electrode 13c. The first opening CH1 is formed continuously with the opening of the first passivation film 103. The first insulating film 104 includes an organic insulating film that contains a resin material (an organic material).

The lower electrode 14a is formed on the first insulating film 104. The lower electrode 14a extends through the first opening CH1 and connects the source electrode 13c and the cathode 14b to each other. For example, the lower electrode 14a has a three-layer structure in which two metal films composed of titanium (Ti) interpose a metal film composed of aluminum (Al) therebetween. The lower electrode 14a that contains aluminum has relatively low electrical resistivity because aluminum has relatively low electrical resistivity. The data connection electrode 12a is formed on the first insulating film 104 in the same layer as the lower electrode 14a.

A second insulating film 105a is disposed above the lower electrode 14a and the data connection electrode 12a, and a part thereof is formed in the first opening CH1. For example, the second insulating film 105a is formed so as to fill the first opening CH1 inside the lower electrode 14a.

The second insulating film 105a has an opening on the data connection electrode 12a, and a part of the data electrode 17a is disposed in the opening. The second insulating film 105a includes an inorganic insulating film. For example, the second insulating film 105a is composed of silicon nitride (SiN$_x$) or silicon dioxide (SiO$_2$).

The cathode 14b of the photodiodes 14 is formed on the lower electrode 14a so as to cover a part of the second insulating film 105a and the first opening CH1. The cathode 14b and the lower electrode 14a are in contact with each other. The cathode 14b is composed of titanium (Ti).

The photoelectric conversion layer 15 is formed on the cathode 14b. In the photoelectric conversion layer 15, an n-type amorphous semiconductor layer 151, an intrinsic amorphous semiconductor layer 152, and a p-type amorphous semiconductor layer 153 are stacked in this order. The n-type amorphous semiconductor layer 151 is composed of amorphous silicon doped with n-type impurities (for example, phosphorus). The intrinsic amorphous semiconductor layer 152 is composed of intrinsic amorphous silicon. The intrinsic amorphous semiconductor layer 152 is formed so as to be in contact with the n-type amorphous semiconductor layer 151. The p-type amorphous semiconductor layer 153 is composed of amorphous silicon doped with p-type impurities (for example, boron). The p-type amorphous semiconductor layer 153 is formed so as to be in contact with the intrinsic amorphous semiconductor layer 152. The anode 14c is formed on the photoelectric conversion layer 15. The anode 14c is composed of, for example, ITO (Indium Tin Oxide). An anode protective film 14d is formed so as to cover the anode 14c. The anode protective film 14d has an opening in which parts of the bias wiring line 16 and the bias electrode 17b are disposed. The anode protective film 14d is formed as an inorganic insulating film and is composed of silicon nitride (SiN$_x$) or silicon dioxide (SiO2).

A second passivation film 105b is formed so as to cover at least a part of the second insulating film 105a and the photodiode 14. The second passivation film 105b covers a part of an upper surface of the photodiode 14 and side surfaces of the photodiode 14. The second passivation film 105b has an opening at the same position as the opening of the second insulating film 105a in a plan view. The second passivation film 105b has an opening at the same position as the opening of the anode protective film 14d in a plan view. For example, the second passivation film 105b is formed as an inorganic insulating film and is composed of silicon nitride (SiN$_x$).

A third insulating film 106 is formed in a layer above the first insulating film 104 and is formed so as to cover at least a part of the second passivation film 105b. The third insulating film 106 covers the photodiode 14 and has a function as a flattening film that flattens a step portion that is formed by the photodiode 14. For example, the third insulating film 106 is composed of the same material (the organic insulating film) as the first insulating film 104.

The third insulating film 106 has the data-wiring-line-connection opening CH2 that is formed continuously with the openings of the second passivation film 105b and the second insulating film 105a and the bias-wiring-line-connection opening CH3 that is formed continuously with the openings of the second passivation film 105b and the anode protective film 14d.

The data electrode 17a and the data wiring line 12 are stacked in the data-wiring-line-connection opening CH2 on the third insulating film 106. The bias electrode 17b and the bias wiring line 16 are stacked in the bias-wiring-line-connection opening CH3 on the third insulating film 106. The data wiring lines 12 and the data connection electrode 12a are connected to each other with the data-wiring-line-connection opening CH2 interposed therebetween. The bias wiring line 16 and the photodiode 14 are connected to each other with the bias-wiring-line-connection opening CH3 interposed therebetween. For example, the data electrode 17a and the bias electrode 17b have a three-layer structure in which two metal films composed of titanium (Ti) interpose a metal film composed of aluminum (Al) therebetween. The data wiring line 12 and the bias wiring line 16 are composed of, for example, ITO.

A fourth insulating film 107 is formed on the third insulating film 106 so as to cover the data wiring line 12 and the bias wiring line 16. The fourth insulating film 107 functions as a passivation film. The fourth insulating film 107 is formed as an inorganic insulating film and is composed of silicon nitride ($SiN_x$) or silicon dioxide ($SiO_2$).

A fifth insulating film 108 is formed so as to cover the fourth insulating film 107. The fifth insulating film 108 has a function as a protective film that protects the fourth insulating film 107 and a function of flattening a portion above the data wiring line 12 and the bias wiring line 16. The fifth insulating film 108 is composed of, for example, the same material (the organic insulating film) as the first insulating film 104.

FIG. 4 is a partial enlarged view of the first opening CH1 in FIG. 3. As for the first opening CH1, as illustrated in FIG. 4, an oblique angle θ1 with respect to the horizontal plane of the cathode 14b of the photodiode 14 is smaller than an oblique angle θ2 with respect to the horizontal plane of the lower electrode 14a. That is, the second insulating film 105a is disposed in the first opening CH1, and consequently, the photodiode 14 that is disposed on the second insulating film 105a is flattened. This structure enables the second insulating film 105a that is formed in the first opening CH1 to inhibit a lower portion of the photodiode 14 from being fitted into the first opening CH1. In this way, the photodiode 14 is inhibited from having unevenness. Consequently, leakage current at the photodiode 14 can be inhibited from increasing even in the case where the first insulating film 104 that covers the TFT 13 has the first opening CH1 for connecting the TFT 13 and the lower electrode 14a that is disposed below the photodiode 14 to each other. The X-ray imaging panel 1 can be such that the photodiode 14 and the TFT 13 overlap in a plan view in a manner in which the first opening CH1 is formed below the photodiodes 14. Accordingly, dimensions per pixel or a pitch between pixels can be decreased. Consequently, the resolution of the X-ray imaging panel 1 can be high.

(Method of Manufacturing X-ray Imaging Panel)

Figure 5:
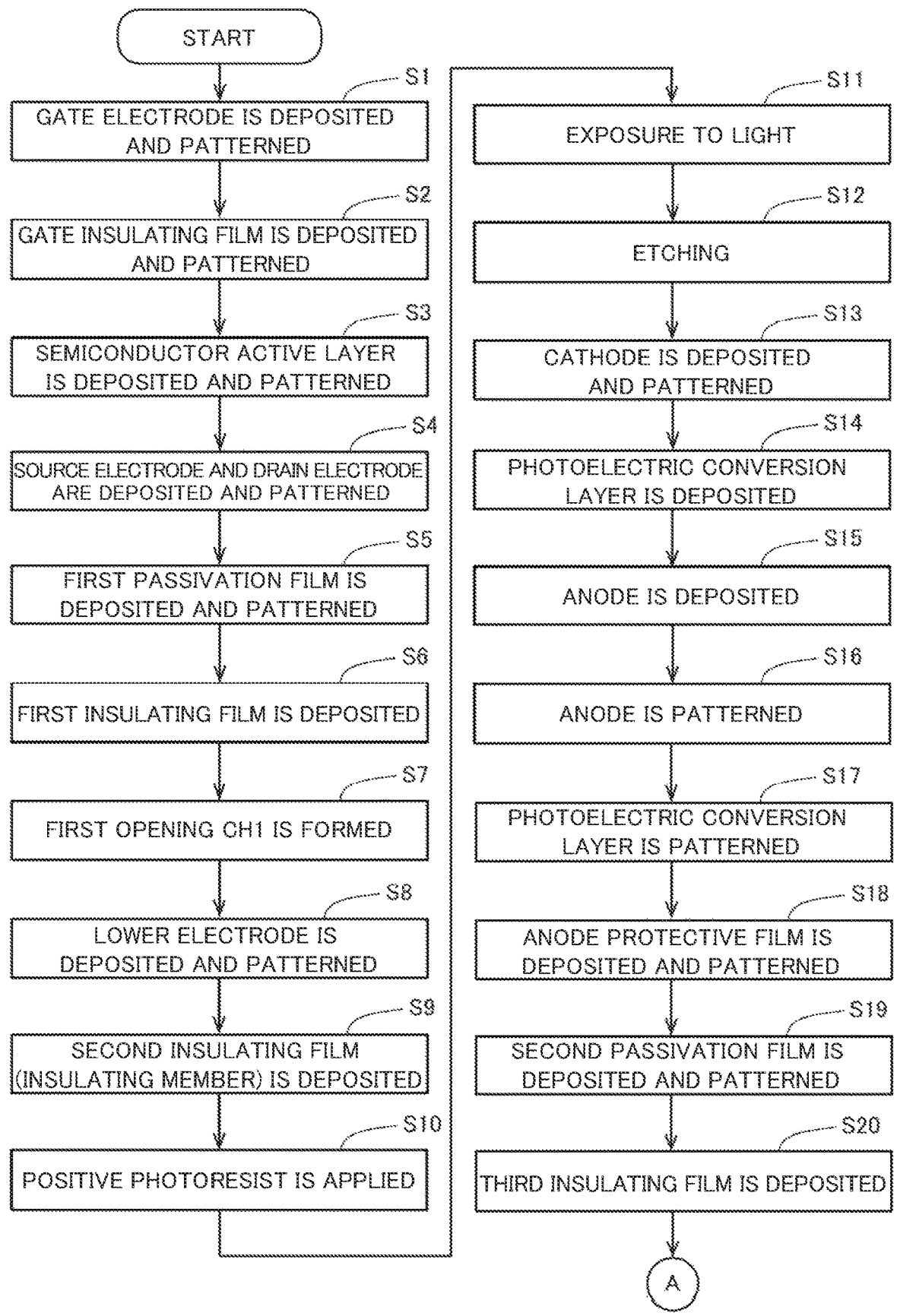
FIG. 5 is a flowchart (1) for description of the processing of manufacturing the X-ray imaging panel according to the first embodiment.
Figure 6:
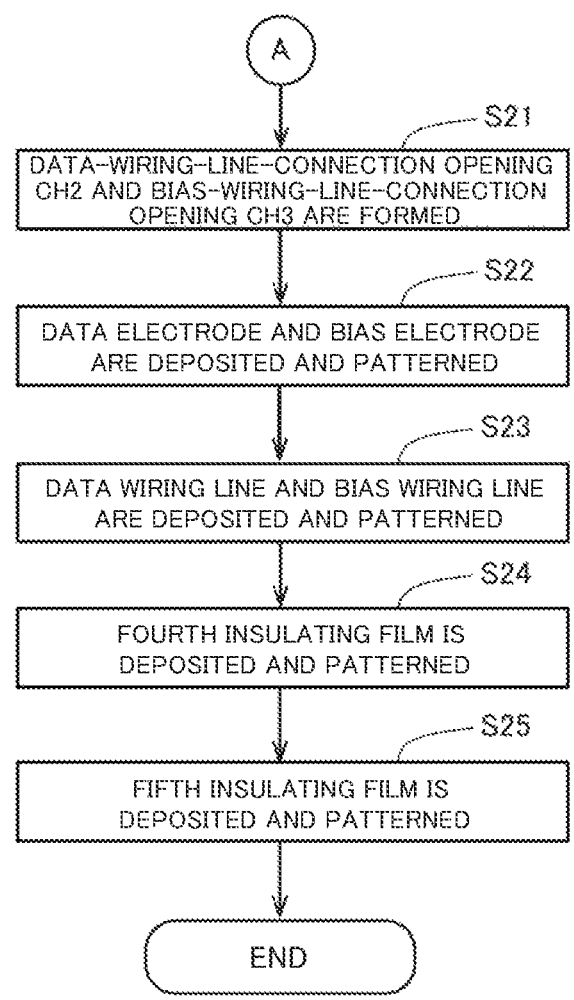
FIG. 6 is a flowchart (2) for description of the processing of manufacturing the X-ray imaging panel according to the first embodiment.

A method of manufacturing the X-ray imaging panel 1 according to the first embodiment will now be described with reference to FIG. 5 to FIG. 16. FIG. 5 and FIG. 6 are flowcharts for description of the processing of manufacturing the X-ray imaging panel 1.

Figure 7:
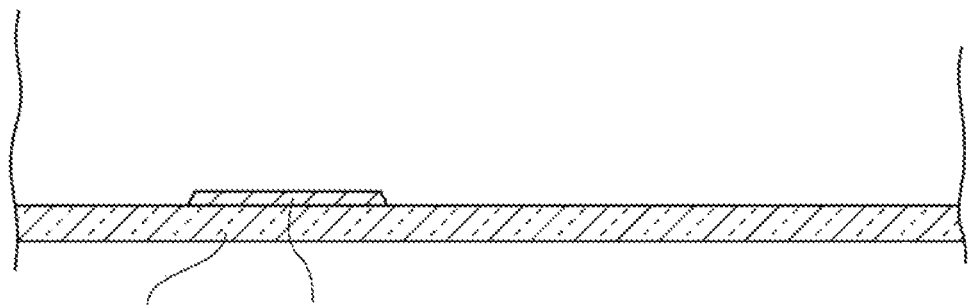
FIG. 7 is a diagram for description of formation of a gate electrode.

As illustrated in FIG. 7, at a step S1, the gate electrode 13a is deposited and patterned on the substrate 101. The gate wiring line 11 is formed integrally with the gate electrode 13a when the gate electrode 13a is deposited although this is not illustrated in FIG. 7.

Figure 8:
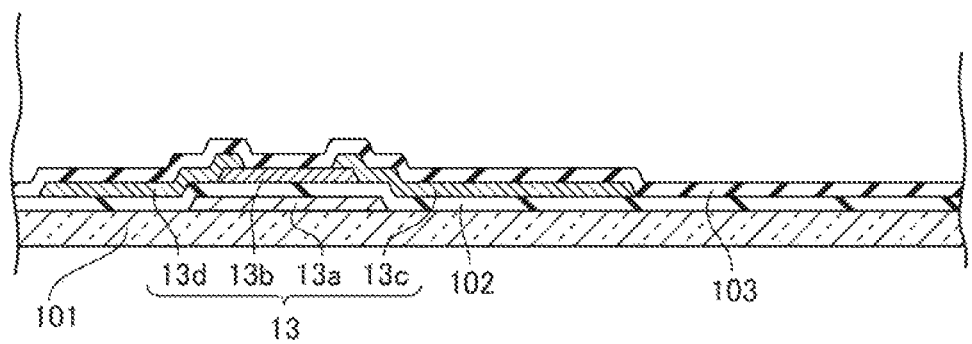
FIG. 8 is a diagram for description of formation of a TFT.

As illustrated in FIG. 8, at a step S2, the gate insulating film 102 is deposited and patterned so as to cover the gate electrode 13a. At a step S3, the semiconductor active layer 13b that contains indium (In), gallium (Ga), zinc (Zn), and oxygen (O) is deposited and patterned on the gate insulating film 102. At a step S4, the source electrode 13c and the drain electrode 13d are deposited and patterned on the gate insulating film 102. The source electrode 13c and the drain electrode 13d are formed in the same layer. Consequently, the TFT 13 is formed.

Figure 9:
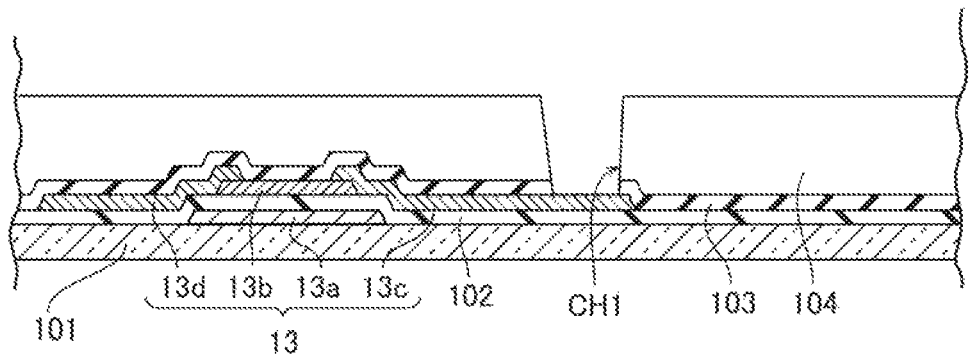
FIG. 9 is a diagram for description of formation of the first opening.

As illustrated in FIG. 9, at a step S5, the first passivation film 103 is deposited and patterned on the gate insulating film 102 so as to cover the source electrode 13c and the drain electrode 13d. At a step S6, the first insulating film 104 is deposited on the first passivation film 103. At a step S7, the first opening CH1 is formed in the first insulating film 104 above the TFT 13 (the source electrode 13c) by photolithography, and an opening that is connected to the first opening CH1 is formed in the first passivation film 103.

Figure 10:
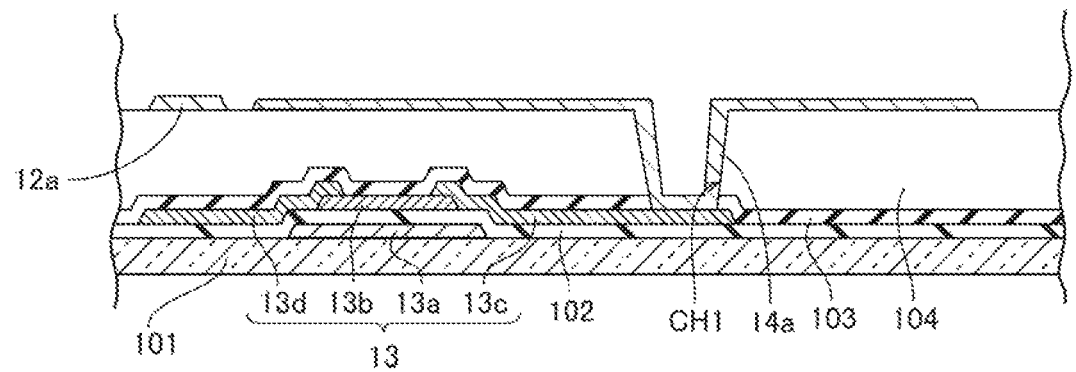
FIG. 10 is a diagram for description of formation of a lower electrode.

As illustrated in FIG. 10, at a step S8, the lower electrode 14a is deposited and patterned in the first opening CH1 so as to cover at least a part of the first insulating film 104 and so as to be connected to the source electrode 13c in the first opening CH1. At the step S8, the data connection electrode 12a is deposited and patterned in the same layer as the lower electrode 14a.

Figure 11:
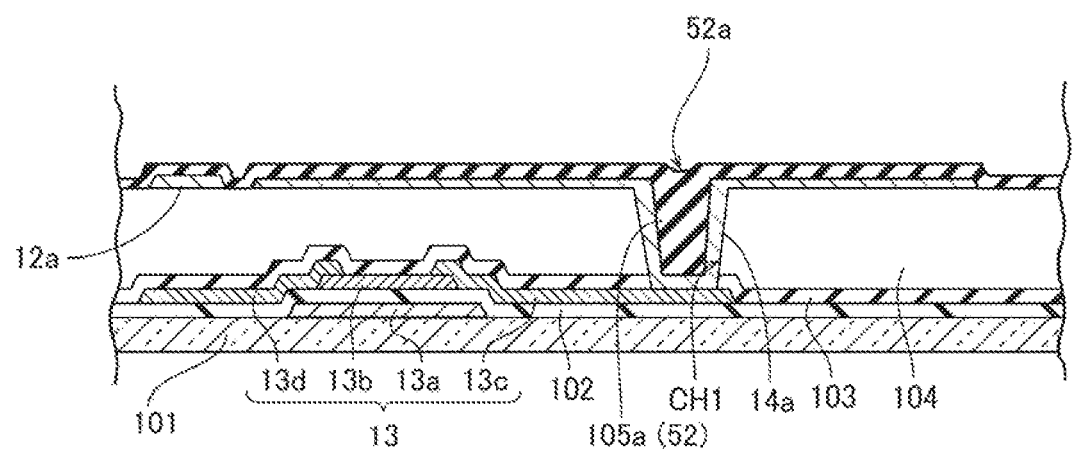
FIG. 11 is a diagram for description of formation of a second insulating film.

As illustrated in FIG. 11, at a step S9, the second insulating film 105a (the insulating member) is deposited so as to cover the lower electrode 14a. Specifically, the second insulating film 105a is deposited above the lower electrode 14a so as to fill the first opening CH1. At this time, a recessed portion 52a that is recessed downward is formed in a portion 52 of the second insulating film 105a that fills the first opening CH1.

Figure 12:
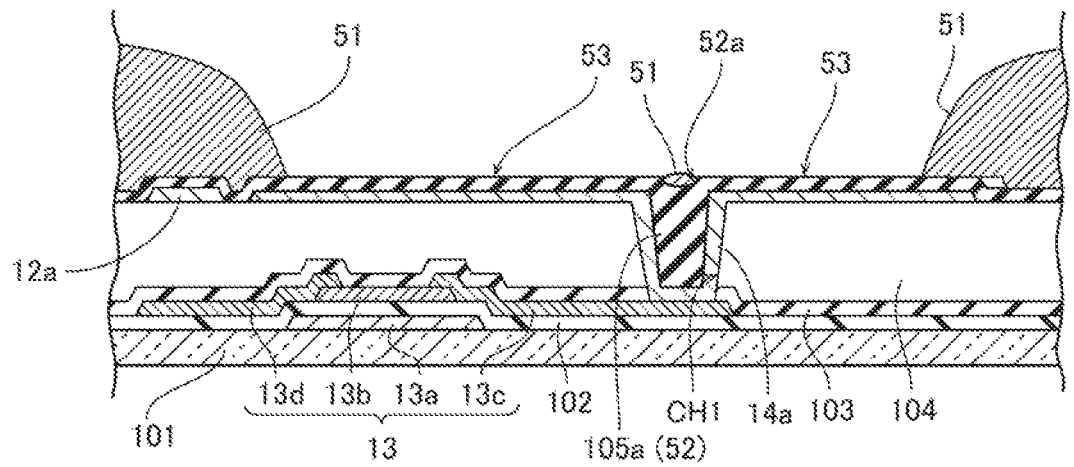
FIG. 12 is a diagram for description of application of positive photoresist.

As illustrated in FIG. 12, at a step S10, positive photoresist 51 is applied so as to cover the second insulating film 105a. Consequently, the positive photoresist 51 is disposed also in the recessed portion 52a. At a step S11, the positive photoresist 51 is exposed to light and is partly removed. Specifically, the positive photoresist 51 at a portion 53 of the second insulating film 105a above the lower electrode 14a is removed. Since the recessed portion 52a is recessed, the positive photoresist 51 remains in the recessed portion 52a by being exposed to light in a normal exposure amount even when a mask is not used for the recessed portion 52a during photolithography. In the case of exposure in the normal exposure amount, the positive photoresist 51 is not exposed to light in a depth direction, and the positive photoresist 51 that is applied to the recessed portion 52a is not developed and remains. In other words, self-alignment enables the positive photoresist 51 to remain, and a mask is not needed for the recessed portion 52a. Accordingly, it is not necessary to consider misalignment of a mask when the mask is used for photolithography (the load of operation of aligning the mask can be reduced). The present disclosure is not limited by exposure in the normal exposure amount. The positive photoresist 51 may be exposed to light so as to have a desired shape by adjustment in the exposure amount (the exposure amount is decreased to an amount smaller than the normal exposure amount).

Figure 13:
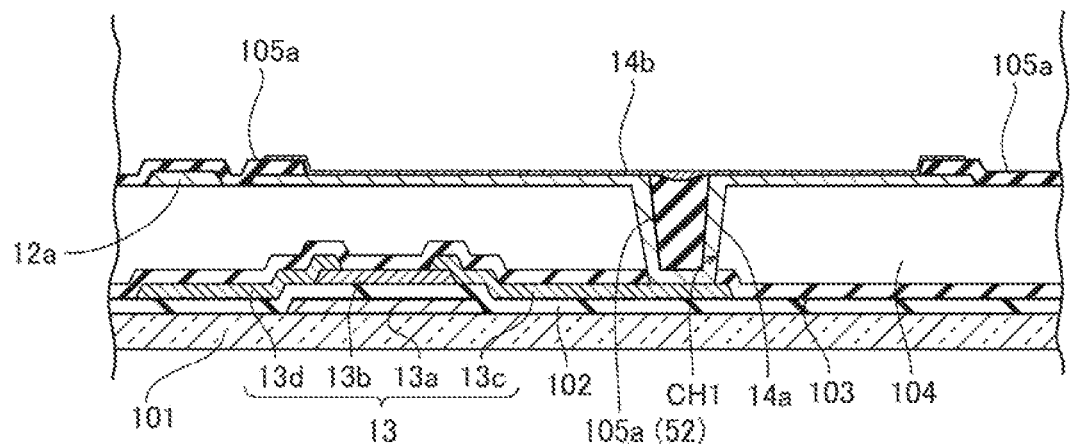
FIG. 13 is a diagram for description of formation of a cathode.

As illustrated in FIG. 13, at a step S12, the portion 53 of the second insulating film 105a at which the positive photoresist 51 is removed is etched, and consequently, the lower electrode 14a is exposed. At a step S13, the cathode 14b of the photodiode 14 is deposited and patterned on the lower electrode 14a that is exposed.

Figure 14:
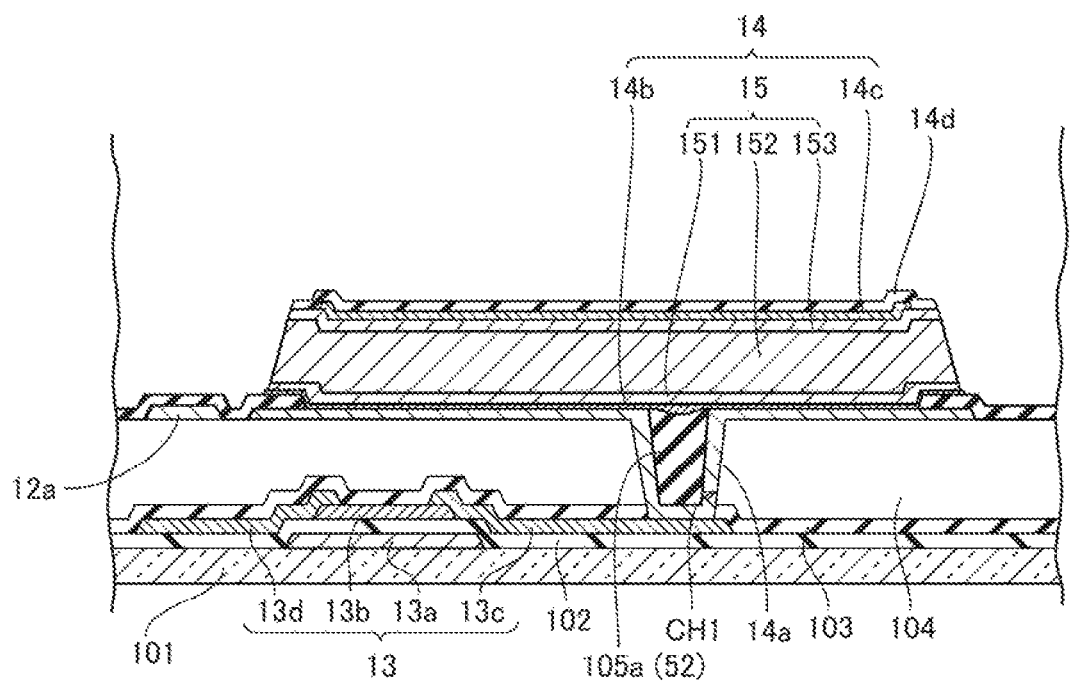
FIG. 14 is a diagram for description of formation of a photodiode.

As illustrated in FIG. 14, at a step S14, the photoelectric conversion layer 15 is deposited. Specifically, the n-type amorphous semiconductor layer 151, the intrinsic amorphous semiconductor layer 152, and the p-type amorphous semiconductor layer 153 are stacked in this order. At a step S15, the anode 14c is deposited. At a step S16, the anode 14c is patterned. At a step S17, the photoelectric conversion layer 15 is patterned. At a step S18, the anode protective film 14d is deposited and patterned so as to cover the anode 14c. Consequently, the photodiode 14 is formed.

Figure 15:
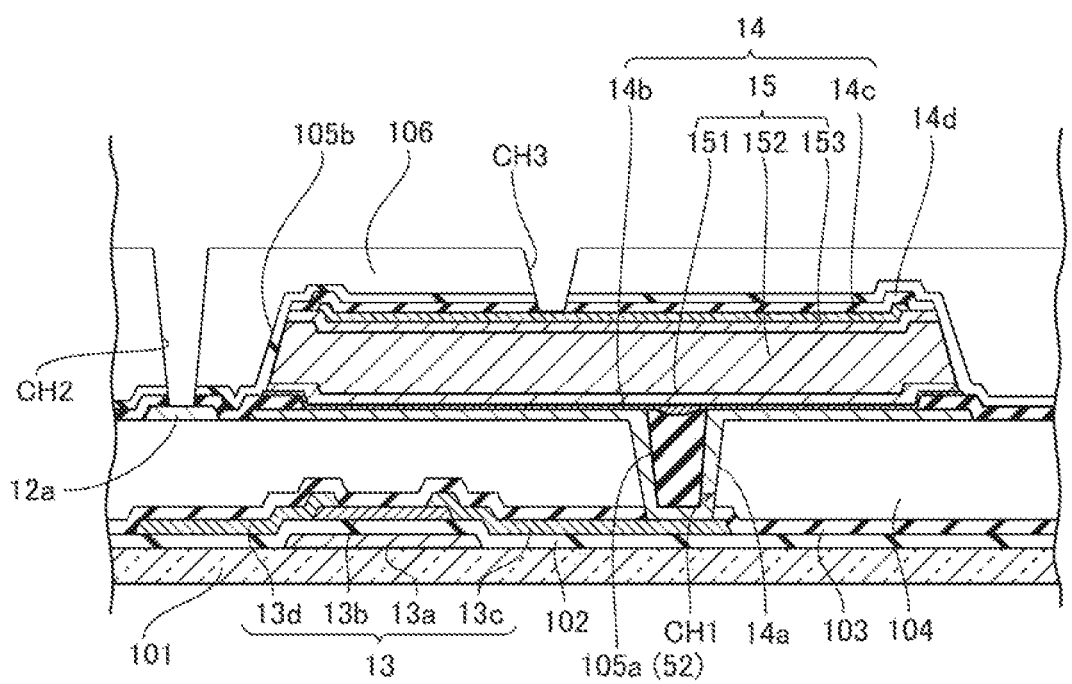
FIG. 15 is a diagram for description of formation of a data-wiring-line-connection opening and a bias-wiring-line-connection opening.

As illustrated in FIG. 15, at a step S19, the second passivation film 105b is deposited so as to cover at least a part of the second insulating film 105a and the photodiode 14. At a step S20, the third insulating film 106 is deposited so as to cover the second passivation film 105b. At a step S21, the data-wiring-line-connection opening CH2 is formed by photolithography so as to extend up to the data connection electrode 12a through the second insulating film 105a, the second passivation film 105b, and the third insulating film 106, and the bias-wiring-line-connection opening CH3 is formed so as to extend up to the anode 14c through the anode protective film 14d, the second passivation film 105b, and the third insulating film 106.

Figure 16:
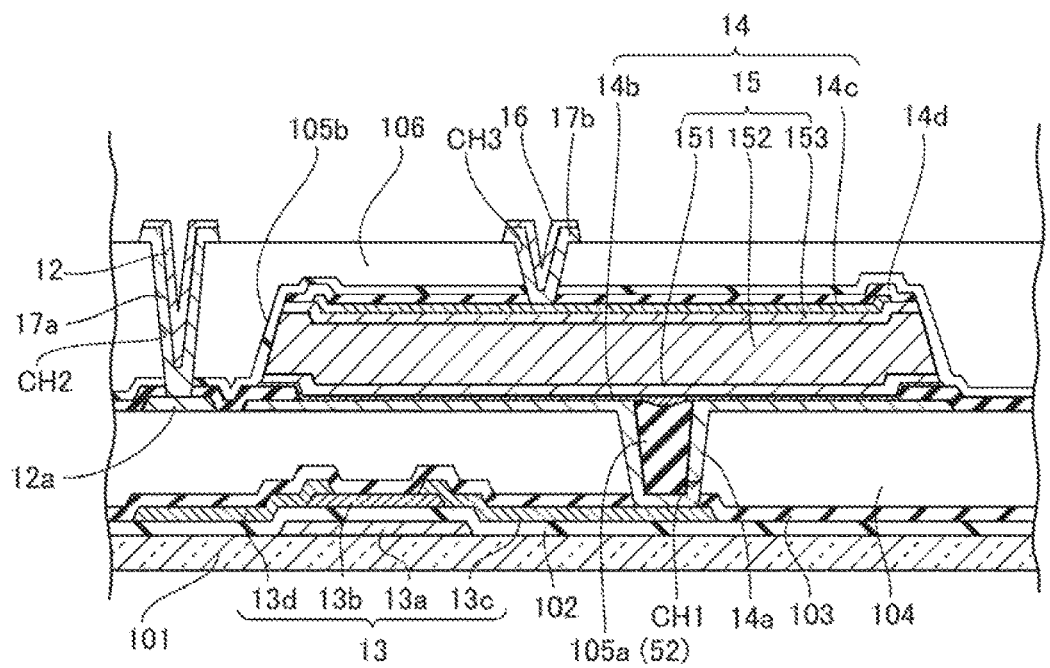
FIG. 16 is a diagram for description of formation of a data wiring line and a bias wiring line.

As illustrated in FIG. 16, at a step S22, the data electrode 17a and the bias electrode 17b are deposited and patterned. Consequently, the data electrode 17a is formed in the data-wiring-line-connection opening CH2, and the bias electrode 17b is formed in the bias-wiring-line-connection opening CH3. At a step S23, the data wiring line 12 and the bias wiring line 16 are deposited and patterned. Consequently, the data wiring line 12 is formed in the data-wiring-line-connection opening CH2, and the bias wiring line 16 is formed in the bias-wiring-line-connection opening CH3.

As illustrated in FIG. 3, at a step S24, the fourth insulating film 107 is deposited and patterned on the third insulating film 106 so as to cover the data wiring line 12 and the bias wiring line 16. At a step S25, the fifth insulating film 108 is deposited and patterned so as to cover the fourth insulating film 107. Consequently, the X-ray imaging panel 1 is completed.

The method described above inhibits the photodiode 14 from having unevenness. Accordingly, the leakage current at the photodiode 14 can be inhibited from increasing even in the case where the first insulating film 104 that covers the TFT 13 has the first opening CH1. The X-ray imaging panel 1 can be such that the photodiode 14 and the TFT 13 overlap in a plan view in a manner in which the first opening CH1 is formed below the photodiode 14. Accordingly, the dimensions per pixel or the pitch between the pixels can be decreased. Consequently, the resolution of the X-ray imaging panel 1 can be high.

Second Embodiment

Figure 17:
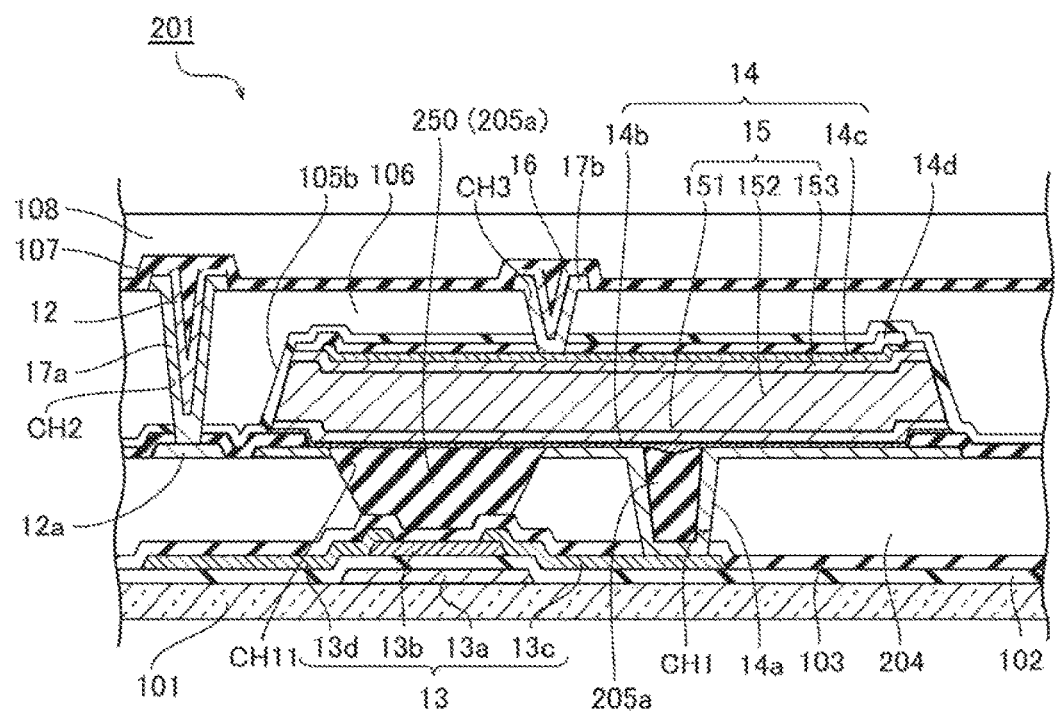
FIG. 17 is a sectional view of the structure of an X-ray imaging panel according to a second embodiment.

FIG. 17 illustrates the structure of an X-ray imaging panel 201 according to a second embodiment. According to the second embodiment, a part of a second insulating film 205a is disposed above the semiconductor active layer 13b (the first semiconductor layer). Components like to those according to the first embodiment are designated by reference signs like to those according to the first embodiment, and the description thereof is omitted.

(Structure According to Second Embodiment)

As illustrated in FIG. 17, the X-ray imaging panel 201 includes a first insulating film 204 and the second insulating film 205a. The first insulating film 204 has a second opening CH11 above the semiconductor active layer 13b that contains indium (In), gallium (Ga), zinc (Zn), and oxygen (O). The second insulating film 205a includes a portion 250 that fills the second opening CH11. In an example illustrated in FIG. 17, the lower electrode 14a is not in the second opening CH11 (removed). However, a part of the lower electrode 14a may be disposed in the second opening CH11.

In a comparative example, an organic insulating film is disposed above a semiconductor layer that contains indium, gallium, zinc, and oxygen. In some cases where water or hydrogen enters the semiconductor layer via the organic insulating film, the semiconductor layer is reduced, and a TFT that includes the semiconductor layer cannot be turned off. With the structure according to the second embodiment, however, the second insulating film 205a of the inorganic insulating film is formed in the second opening CH11 above the semiconductor active layer 13b, and accordingly, the second insulating film 205a prevents water or hydrogen from entering the semiconductor active layer 13b via the first insulating film 204 (the organic insulating film). Accordingly, the semiconductor active layer 13b is prevented from being reduced, and it is prevented that the TFT 13 cannot be turned off. In the case where the second insulating film 205a is composed of silicon nitride (SiNx), water is more effectively blocked and is further inhibited from entering the TFT 13 (the semiconductor active layer 13b). The other structures according to the second embodiment are the same as those according to the first embodiment.

(Manufacturing Method According to Second Embodiment)

Figure 18:
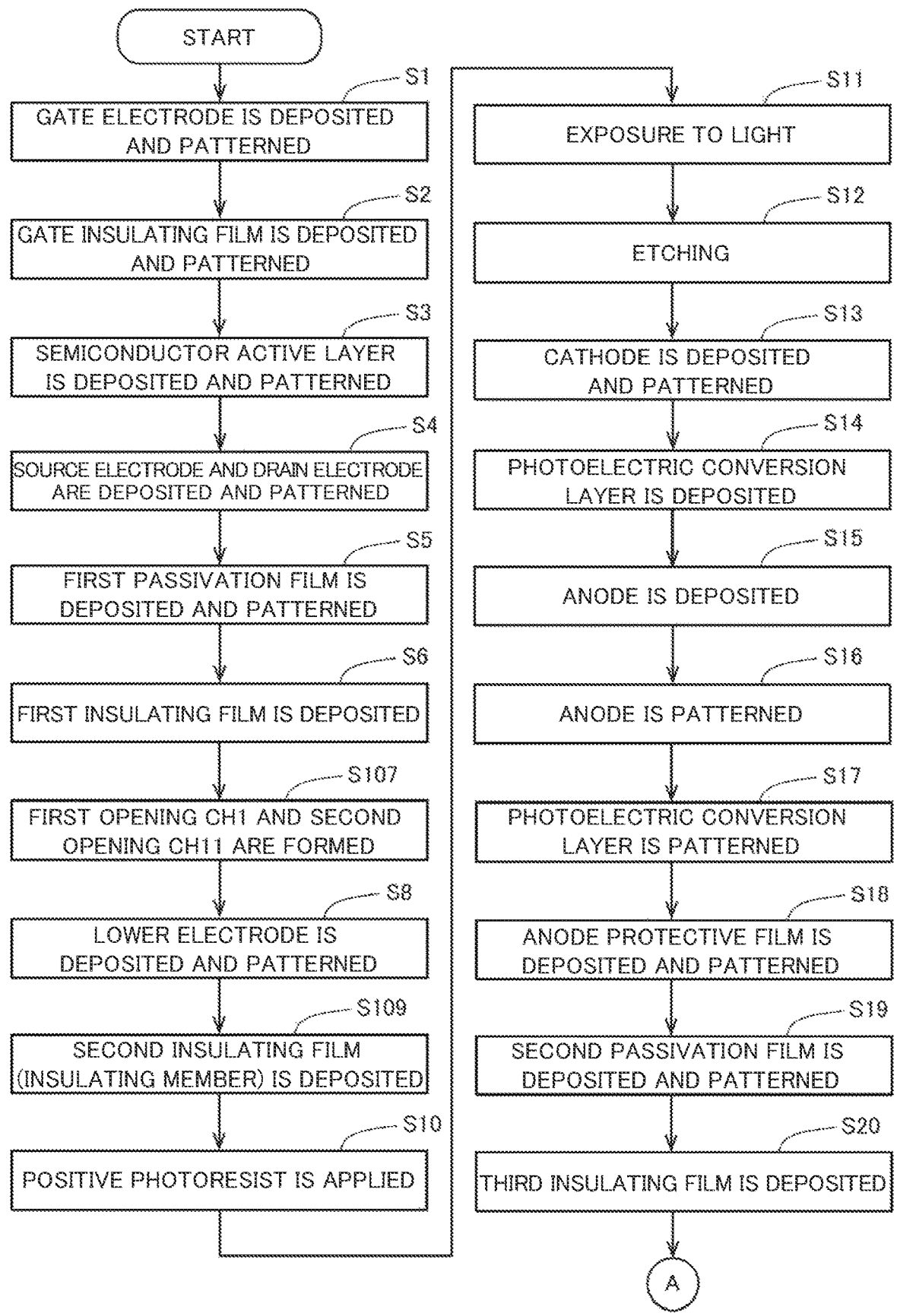
FIG. 18 is a flowchart for description of the processing of manufacturing the X-ray imaging panel according to the second embodiment.

A method of manufacturing the X-ray imaging panel 201 according to the second embodiment will now be described with reference to FIG. 17 and FIG. 18. FIG. 18 is a flowchart for description of the processing of manufacturing the X-ray imaging panel 201 according to the second embodiment. Manufacturing steps like to those according to the first embodiment are designated by like reference signs, and the description thereof is omitted.

As illustrated in FIG. 18, at a step S107 that is performed after the step S6, the first opening CH1 and the second opening CH11 (see FIG. 17) are formed in the first insulating film 204. In a step S109 that is performed after the step S8, the second insulating film 205a is formed in the first opening CH1 and in the second opening CH11. The inorganic insulating film is formed in the second opening CH11 above the semiconductor active layer 13b by the manufacturing method, and accordingly, the inorganic insulating film prevents water or hydrogen from entering the semiconductor active layer 13b via the first insulating film 204 (the organic insulating film). Accordingly, the semiconductor active layer 13b can be prevented from being reduced, and it is prevented that the TFT 13 cannot be turned off.

Third Embodiment

Figure 19:
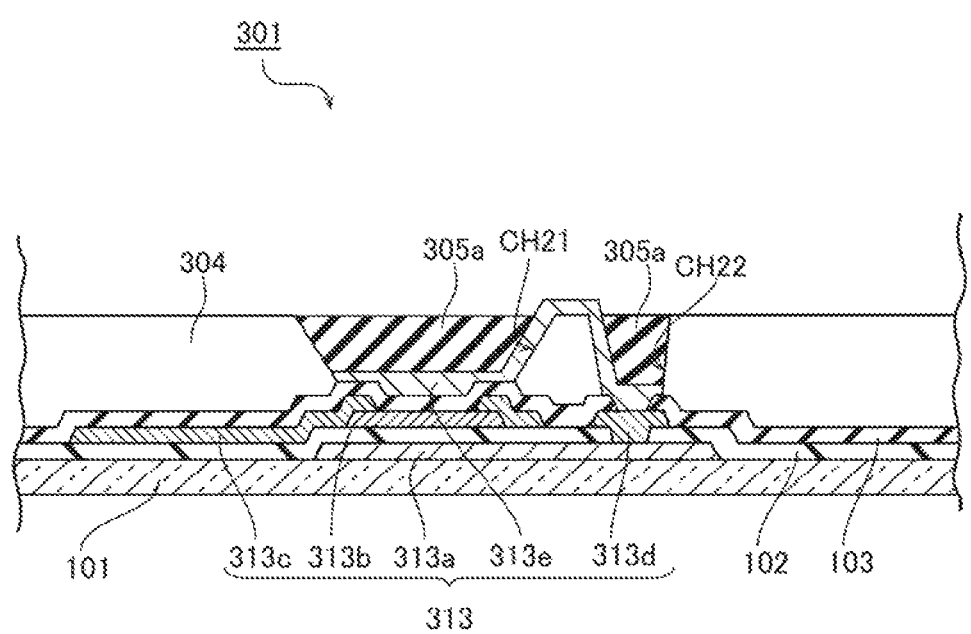
FIG. 19 is a sectional view of the structure of an X-ray imaging panel according to a third embodiment.

FIG. 19 illustrates the structure of an X-ray imaging panel 301 according to a third embodiment. According to the third embodiment, a double gate structure TFT 313 is formed when the TFT 13 and the photodiode 14 are formed according to the first embodiment or the second embodiment. Components like to those according to the first embodiment or the second embodiment are designated by reference signs like to those according to the first embodiment, and the description thereof is omitted.

(Structure According to Third Embodiment)

As illustrated in FIG. 19, the X-ray imaging panel 301 includes the double gate structure TFT 313 (a second thin-film transistor), a first insulating film 304, and a second insulating film 305a. For example, the double gate structure TFT 313 is formed as a protective element that is disposed between the TFT 13 and the control unit 3 or a protective element that is disposed between the photodiode 14 and the control unit 3. The double gate structure TFT 313 may be formed as a TFT in a driver circuit.

The double gate structure TFT 313 includes a gate electrode 313a, a gate electrode 313e, a semiconductor active layer 313b, a source electrode 313c, and a drain electrode 313d. The gate electrode 313a and the gate electrode 313e are formed so as to interpose the semiconductor active layer 313b therebetween in the thickness direction of the X-ray imaging panel 301 (the vertical direction). Consequently, the gate electrode 313a and the gate electrode 313e function as a double gate electrode in the double gate structure TFT 313.

The gate electrode 313a is formed in the same layer as the gate electrode 13a (see FIG. 3). The semiconductor active layer 313b is formed in the same layer as the semiconductor active layers 13b (see FIG. 3). The gate electrode 313e is formed in the same layer as the lower electrode 14a (see FIG. 3).

The first insulating film 304 has a third opening CH21 above the semiconductor active layer 313b and a fourth opening CH22 above the gate electrode 313a and the drain electrode 313d. The gate electrode 313e is formed across the third opening CH21 and the fourth opening CH22 and is connected to the drain electrode 313d in the fourth opening CH22. The second insulating film 305a is formed on the gate electrode 313e so as to fill the third opening CH21 and the fourth opening CH22.

With this structure, the double gate structure TFT 313 can be formed in the X-ray imaging panel 301 at the same time the TFT 13 and the photodiode 14 are formed. In the case where this element 313 has the double gate structure, drive current when this element 313 is driven can be increased. The other structures according to the second embodiment are the same as those according to the first embodiment.

(Manufacturing Method According to Third Embodiment)

Figure 20:
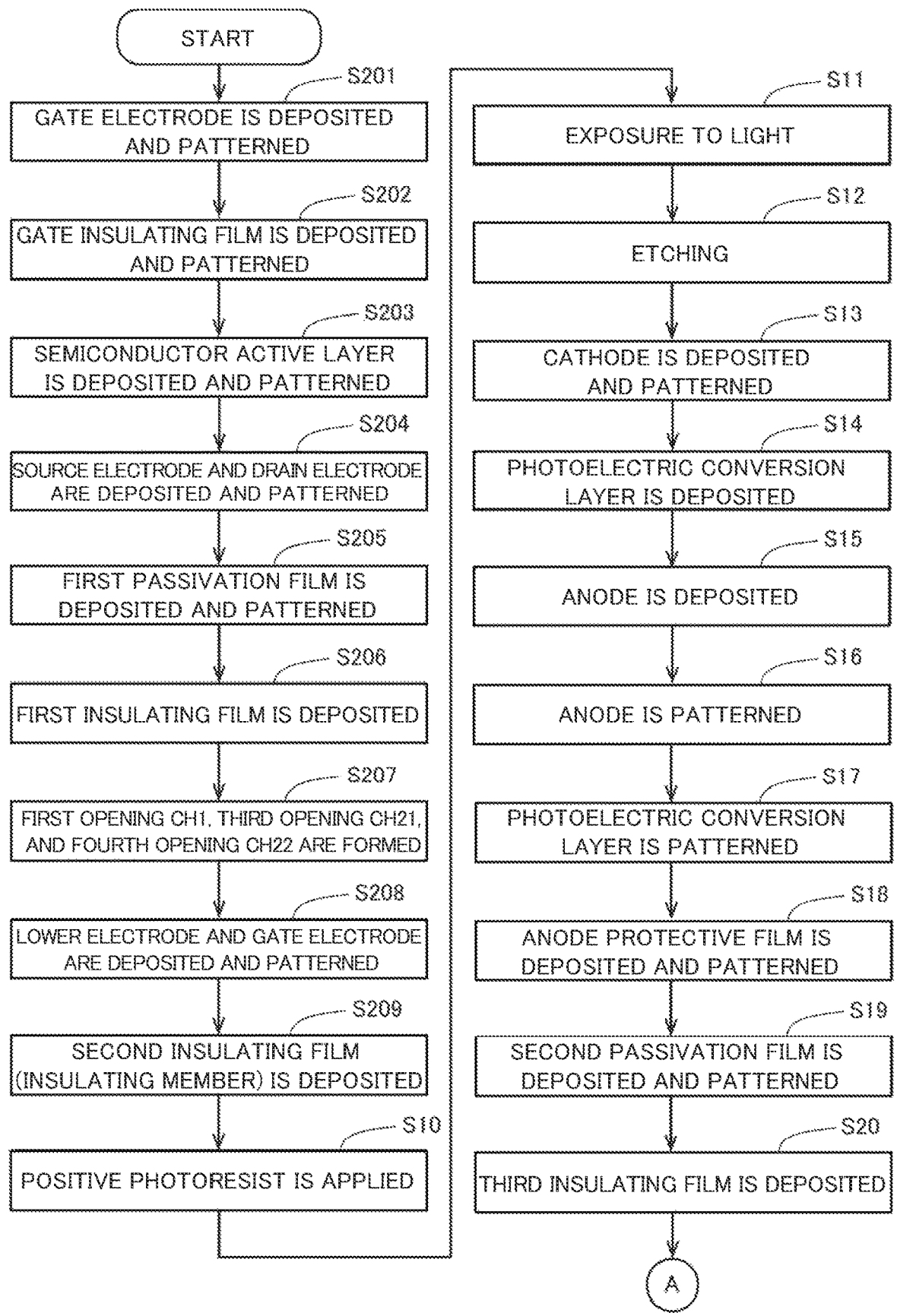
FIG. 20 is a flowchart for description of the processing of manufacturing the X-ray imaging panel according to the third embodiment.

A method of manufacturing the X-ray imaging panel 301 according to the third embodiment will now be described with reference to FIG. 19 and FIG. 20. FIG. 20 is a flowchart for description of the processing of manufacturing the X-ray imaging panel 301 according to the third embodiment. Manufacturing steps like to those according to the first embodiment are designated by like reference signs, and the description thereof is omitted.

As illustrated in FIG. 20, at a step S201, the gate electrode 313a is deposited and patterned as illustrated in FIG. 19 in addition to the gate electrode 13a (see FIG. 7). At a step S202, the gate insulating film 102 is deposited and patterned so as to cover the gate electrode 13a and the gate electrode 313a. The gate insulating film 102 has the fourth opening CH22.

At a step S203, the semiconductor active layer 13b and the semiconductor active layer 313b are deposited and patterned on the gate insulating film 102. At a step S204, the source electrodes 13c and 313c and the drain electrodes 13d and 313d are deposited and patterned on the gate insulating film 102. The drain electrode 313d is formed in the fourth opening CH22 and is connected to the gate electrode 313a in the fourth opening CH22.

At a step S205, the first passivation film 103 is deposited and patterned on the gate insulating film 102 so as to cover the source electrodes 13c and 313c and the drain electrodes 13d and 313d. The fourth opening CH22 is formed in the first passivation film 103. At a step S206, the first insulating film 304 is deposited on the first passivation film 103. At a step S207, the third opening CH21 is formed in the first insulating film 304 above the semiconductor active layer 313b by photolithography in addition to the first opening CH1 (see FIG. 3), and the fourth opening CH22 is formed in the first insulating film 304 above the drain electrode 313d.

At a step S208, the lower electrode 14a is deposited in the first opening CH1, the gate electrode 313e is deposited across the third opening CH21 and the fourth opening CH22, and the lower electrode 14a and the gate electrode 313e are patterned. At a step S209, the second insulating film 305a (the insulating member) is deposited so as to cover the lower electrode 14a and the gate electrode 313e. Specifically, the second insulating film 305a is deposited so as to fill the first opening CH1, the third opening CH21, and the fourth opening CH22.

After the step S209, the positive photoresist is applied as in the first or second embodiment described above and is subsequently exposed to light. Consequently, the positive photoresist that is readily self-aligned can remain in the third opening CH21 and the fourth opening CH22. This enables the double gate structure TFT 313 to be readily formed. Subsequently, the X-ray imaging panel 301 is completed.

[Modification]

The embodiments are described above. However, the embodiments described above are examples for carrying out the present disclosure. Accordingly, the present disclosure is not limited to the embodiments described above, and the embodiments described above can be appropriately modified and carried out without departing from the spirit thereof.

(1) Examples of the materials of the layers (the films) that are included in the X-ray imaging panels according to the first to third embodiments are described but are not limited thereto. That is, the layers (the films) may be composed of materials other than the materials described above.

(2) In examples described according to the first to third embodiments, the source electrode and the lower electrode are connected to each other, and the drain electrode and the data wiring line are connected to each other, but these are not limited thereto. That is, the drain electrode and the lower electrode may be connected to each other, and the source electrode and the data wiring line may be connected to each other.

(3) In examples described according to the first to third embodiments, the first opening is filled with the second insulating film but is not limited thereto. In the case where the first opening is filled with the second insulating film, the unevenness of the photodiode can be reduced more than that in the case where it is not filled. However, in the case where at least a part of the second insulating film is disposed in the first opening, the unevenness of the photodiode can be reduced even when the first opening is not filled.

The X-ray imaging panels and the methods of manufacturing the X-ray imaging panels described above can also be described as follows.

A X-ray imaging panel with a first feature includes a photodiode that converts scintillation light that is obtained from an X-ray that passes through an object into a signal, a first thin-film transistor, a first insulating film that covers at least a part of the first thin-film transistor and that has a first opening above the first thin-film transistor, a lower electrode that is disposed below the photodiode, that covers at least a part of the first insulating film, that is formed in the first opening of the first insulating film, and that is connected to the first thin-film transistor in the first opening, and a second insulating film that is disposed above the lower electrode and that is formed in the first opening. The photodiode covers the first opening in which the second insulating film is formed, and the photodiode is connected to the lower electrode (the first feature).

The first feature enables the second insulating film that is formed in the first opening to inhibit a lower portion of the photodiode from being fitted into the first opening. In this way, the photodiode is inhibited from having unevenness. Consequently, the leakage current at the photodiode can be inhibited from increasing even in the case where the first insulating film that covers the first thin-film transistor has the first opening for connecting the first thin-film transistor and the lower electrode that is disposed below the photodiode to each other. The X-ray imaging panel can be such that the photodiode and the first thin-film transistor overlap in a plan view in a manner in which the first opening is formed below the photodiode. Accordingly, the dimensions per pixel or the pitch between the pixels can be decreased. Consequently, the resolution of the X-ray imaging panel can be high.

As for the first feature described above, the photodiode may include a cathode that is connected to the lower electrode and that covers a portion of the second insulating film that is formed in the first opening (a second feature).

The second feature enables the cathode to connect the photodiode and the lower electrode to each other and inhibits the cathode from being fitted into the first opening. Accordingly, the photodiode that includes the cathode can be inhibited from having unevenness.

As for the first or second feature described above, the first thin-film transistor may include a first semiconductor layer that contains indium, gallium, zinc, and oxygen. The first insulating film may include an organic insulating film and has a second opening that is formed above the first semiconductor layer. The second insulating film may include an inorganic insulating film and is formed in the first opening and in the second opening (a third feature).

In some cases where water or hydrogen enters the first semiconductor layer that contains indium, gallium, zinc, and oxygen via the first insulating film (the organic insulating film), the first semiconductor layer is reduced, and the first thin-film transistor cannot be turned off. With the third feature described above, however, the inorganic insulating film is formed in the second opening above the first semiconductor layer, and accordingly, the inorganic insulating film prevents water or hydrogen from entering the first semiconductor layer via the first insulating film (the organic insulating film). Consequently, it is prevented that the first thin-film transistor cannot be turned off.

As for any one of the first to third features described above, the first thin-film transistor may include a first gate electrode and a first semiconductor layer, the X-ray imaging panel may further include a second thin-film transistor that includes a second gate electrode that is formed in the same layer as the first gate electrode, a third gate electrode that is formed in the same layer as the lower electrode, and a second semiconductor layer that is formed between the second gate electrode and the third gate electrode in a vertical direction and in the same layer as the first semiconductor layer, the first insulating film may have a third opening that is formed above the second semiconductor layer and a fourth opening that is formed above the second gate electrode, the third gate electrode may be formed across the third opening and the fourth opening and may be connected to the second gate electrode in the fourth opening. The second insulating film may be disposed in the third opening and in the fourth opening above the third gate electrode (a fourth feature).

The fourth feature enables the X-ray imaging panel to include the second thin-film transistor that has the double gate structure when the thin-film transistor and the photodiode that have any one of the first to third features described above are formed. In the case where the second thin-film transistor has the double gate structure, drive current when the second thin-film transistor is driven can be increased.

A method of manufacturing an X-ray imaging panel with a fifth feature is a method of manufacturing an X-ray imaging panel that includes a photodiode that converts scintillation light that is obtained from an X-ray that passes through an object into a signal. The method includes a step of forming a first thin-film transistor on a substrate, a step of forming a first insulating film such that the first insulating film covers at least a part of the first thin-film transistor, a step of forming a first opening in the first insulating film above the first thin-film transistor, a step of forming a lower electrode in the first opening such that the lower electrode covers at least a part of the first insulating film and is connected to the first thin-film transistor in the first opening, a step of forming a second insulating film in the first opening above the lower electrode, and a step of forming a photodiode such that the photodiode covers the first opening in which the second insulating film is formed, and the photodiode is connected to the lower electrode (the fifth feature).

The fifth feature enables the method of manufacturing an X-ray imaging panel to improve the resolution and to inhibit the leakage current at the photodiode from increasing as in the first feature.

As for the fifth feature described above, the step of forming the second insulating film may include a step of depositing an insulating member such that the insulating member covers the lower electrode and forms a recessed portion in the first opening, a step of disposing positive photoresist on the insulating member, a step of exposing the positive photoresist to light and removing the positive photoresist that is exposed to the light, and a step of removing a portion of the insulating member other than a portion at which the positive photoresist remains by etching the insulating member (a sixth feature).

The sixth feature enables the positive photoresist to readily remain in the recessed portion through exposure in the normal exposure amount without masking the first opening because the recessed portion is recessed. Specifically, in the case of exposure in the normal exposure amount, the positive photoresist is not exposed to light in the depth direction, and the positive photoresist that is disposed to the recessed portion is not developed and remains. The use of this principle enables the positive photoresist to remain in the recessed portion. In other words, self-alignment enables the positive photoresist to remain, and it is not necessary to consider misalignment when a mask is used for photolithography (the load of operation of aligning the mask can be reduced).

According to the fifth or sixth feature described above, the step of forming the first thin-film transistor may include a step of forming a first semiconductor layer that contains indium, gallium, zinc, and oxygen, the step of forming the first insulating film may include a step of depositing the first insulating film by using an organic material. The method may further include a step of forming a second opening in the first insulating film above the first semiconductor layer when the first opening is formed. The step of forming the second insulating film may include a step of depositing the second insulating film in the first opening and in the second opening by using an inorganic material (a seventh feature).

With the seventh feature, the inorganic insulating film is formed in the second opening above the first semiconductor layer, and accordingly, the inorganic insulating film prevents water or hydrogen from entering the first semiconductor layer via the first insulating film (the organic insulating film). Accordingly, the first insulating film can be prevented from being reduced, and it is prevented that the first thin-film transistor cannot be turned off.

As for any one of the fifth to seventh features described above, the step of forming the first thin-film transistor may include a step of forming a first gate electrode on the substrate, and a step of forming a first semiconductor layer above the first gate electrode. The method may further include a step of forming a second thin-film transistor that includes a second gate electrode and a third gate electrode, the step of forming the second thin-film transistor may include a step of forming the second gate electrode in the same layer as the first gate electrode and a step of forming a second semiconductor layer above the second gate electrode and in the same layer as the first semiconductor layer, and a step of forming the third gate electrode above the second semiconductor layer and in the same layer as the lower electrode. The step of forming the first insulating film may include a step of forming a third opening in the first insulating film above the second semiconductor layer and forming a fourth opening in the first insulating film above the second gate electrode. The step of forming the third gate electrode may include a step of forming the third gate electrode across the third opening and the fourth opening such that the second gate electrode and the third gate electrode are connected to each other in the fourth opening. The step of forming the second insulating film may include a step of forming the second insulating film in the third opening and in the fourth opening above the third gate electrode (an eighth feature).

The eighth feature enables the X-ray imaging panel to include the second thin-film transistor that has the double gate structure when the first thin-film transistor and the photodiode are formed by the manufacturing method with any one of the fifth to seventh features described above. In the case where the second thin-film transistor has the double gate structure, the drive current when the second thin-film transistor is driven can be increased.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An X-ray imaging panel comprising:
   a photodiode that converts scintillation light, obtained from an X-ray that passes through an object, into a signal;
   a first thin-film transistor;
   a first insulating film that covers at least a part of the first thin-film transistor and that has a first opening above the first thin-film transistor;
   a lower electrode that is disposed below the photodiode, that covers at least a part of the first insulating film, that is formed in the first opening of the first insulating film, and that is connected to the first thin-film transistor in the first opening; and
   a second insulating film that is disposed above the lower electrode and that is formed in the first opening,
   wherein the photodiode covers the first opening in which the second insulating film is formed, and the photodiode is connected to the lower electrode.

2. The X-ray imaging panel according to claim 1, wherein the photodiode includes a cathode that is connected to the lower electrode and that covers a portion of the second insulating film formed in the first opening.

3. The X-ray imaging panel according to claim 1, wherein the first thin-film transistor includes a first semiconductor layer that contains indium, gallium, zinc, and oxygen,
   wherein the first insulating film includes an organic insulating film and has a second opening that is formed above the first semiconductor layer, and
   wherein the second insulating film includes an inorganic insulating film and is formed in the first opening and in the second opening.

4. The X-ray imaging panel according to claim 1, wherein the first thin-film transistor includes a first gate electrode and a first semiconductor layer,
   wherein the X-ray imaging panel further comprises a second thin-film transistor that includes a second gate electrode formed in the same layer as the first gate electrode, a third gate electrode formed in the same layer as the lower electrode, and a second semiconductor layer formed between the second gate electrode and the third gate electrode in a vertical direction and in the same layer as the first semiconductor layer,
   wherein the first insulating film has a third opening that is formed above the second semiconductor layer and a fourth opening that is formed above the second gate electrode,
   wherein the third gate electrode is formed across the third opening and the fourth opening and is connected to the second gate electrode in the fourth opening, and
   wherein the second insulating film is disposed in the third opening and in the fourth opening above the third gate electrode.

5. A method of manufacturing an X-ray imaging panel that includes a photodiode for converting scintillation light, obtained from an X-ray that passes through an object, into a signal, the method comprising:
   forming a first thin-film transistor on a substrate;
   forming a first insulating film such that the first insulating film covers at least a part of the first thin-film transistor;
   forming a first opening in the first insulating film above the first thin-film transistor;
   forming a lower electrode in the first opening such that the lower electrode covers at least a part of the first insulating film and is connected to the first thin-film transistor in the first opening;
   forming a second insulating film in the first opening above the lower electrode; and
   forming a photodiode such that the photodiode covers the first opening in which the second insulating film is formed, and the photodiode is connected to the lower electrode.

6. The method according to claim 5, wherein forming the second insulating film comprises:
   depositing an insulating member such that the insulating member covers the lower electrode and forms a recessed portion in the first opening;
   disposing positive photoresist on the insulating member;
   exposing the positive photoresist to light and removing the positive photoresist that is exposed to the light; and
   removing a portion of the insulating member other than a portion at which the positive photoresist remains by etching the insulating member.

7. The method according to claim 5, wherein forming the first thin-film transistor includes forming a first semiconductor layer that contains indium, gallium, zinc, and oxygen,
- wherein forming the first insulating film includes depositing the first insulating film by using an organic material,
- wherein the method further comprises forming a second opening in the first insulating film above the first semiconductor layer when the first opening is formed,
- wherein forming the second insulating film includes depositing the second insulating film in the first opening and in the second opening by using an inorganic material.

8. The method according to claim 5, wherein forming the first thin-film transistor comprises:
- forming a first gate electrode on the substrate; and
- forming a first semiconductor layer above the first gate electrode,
- wherein the method further comprises forming a second thin-film transistor that includes a second gate electrode and a third gate electrode,
- wherein forming the second thin-film transistor comprises: forming the second gate electrode in the same layer as the first gate electrode; forming a second semiconductor layer above the second gate electrode and in the same layer as the first semiconductor layer; and forming the third gate electrode above the second semiconductor layer and in the same layer as the lower electrode,
- wherein forming the first insulating film comprises forming a third opening in the first insulating film above the second semiconductor layer and forming a fourth opening in the first insulating film above the second gate electrode,
- wherein forming the third gate electrode comprises forming the third gate electrode across the third opening and the fourth opening such that the second gate electrode and the third gate electrode are connected to each other in the fourth opening, and
- wherein forming the second insulating film comprises forming the second insulating film in the third opening and in the fourth opening above the third gate electrode.

* * * * *